US005850084A

United States Patent [19]

Holkeboer

[11] Patent Number: 5,850,084

[45] Date of Patent: Dec. 15, 1998

[54] ION LENS ASSEMBLY FOR GAS ANALYSIS SYSTEM

[75] Inventor: David H. Holkeboer, Byron Center, Mich.

[73] Assignee: Leybold Inficon Inc., E. Syracuse, N.Y.

[21] Appl. No.: 891,648

[22] Filed: Jul. 11, 1997

Related U.S. Application Data

[63] Continuation-in-part of Ser. No. 863,818, May 27, 1997, which is a continuation of Ser. No. 642,479, May 3, 1996, abandoned.

[51] Int. Cl.[6] .......... H01J 37/08

[52] U.S. Cl. .......... 250/423 R; 250/288

[58] Field of Search .......... 250/423 R, 426, 250/427, 423 F, 288

[56] References Cited

U.S. PATENT DOCUMENTS 4,303,865 12/1981 Swingler .......... 250/423 R

*Primary Examiner*—Kiet T. Nguyen

*Attorney, Agent, or Firm*—Wall Marjama Bilinski & Burr

[57] ABSTRACT

A miniaturized ion source for a mass spectrometer includes a anode and a focus plate whose interior surfaces form an ionization volume for a retained gas sample. Molecules of the gas sample are ionized by electrons, and the resulting ions are concentrated and converged through an exit aperture in the focus plate to the entrance of an ion analyzer, such as a quadrupole mass filter. Preferably, at least one of the anode and the focus plate includes a curved interior surface which converges the formed ions into a focused beam for directing into the ion analyzer. In addition, the thickness of the exit aperture of the focus plate and or the setback of the focus plate relative to the anode ensures that no line of sight exists between the interior surface of the anode from which ion-forming electrons can scatter into the adjacent ion analyzer.

18 Claims, 9 Drawing Sheets

ION LENS ASSEMBLY FOR GAS ANALYSIS SYSTEM

CROSS REFERENCE TO RELATED APPLICATIONS

This application is a continuation-in-part of U.S. application Ser. No. 08/863,818 filed May 27, 1997 [Attorney Docket 247-096/946239] which is a file wrapper continuation of U.S. application Ser. No. 08/642,479, filed May 8, 1996, now abandoned.

FIELD OF THE INVENTION

This invention relates to an ion source for a mass spectrometer, such as used for the analysis of gases in vacuum process equipment, and in particular, to a shaped lens for ion beam focusing and electron rejection in a miniature ion source.

BACKGROUND OF THE INVENTION

Many scientific instruments, such as mass spectrometers using quadrupole filters, require generation of an ion stream so that ions may be accelerated or otherwise input into the instrument for sample identification, measurement, and other purposes.

For a quadrupole residual gas analyzer, it is desirable to indicate the ionization current as a total pressure measurement, in addition to filtering the ion current to indicate specific ion species.

A conventional ion source comprises a filament acting as an electron emitter, with an ion volume containing a rarified gas, and an ion accelerator. Electrons from the filament enter the ion volume through an opening in an ionization chamber surrounding the ion volume, and ionize gas molecules within the ion volume. The ion accelerator draws the resulting ions out of the ion volume and focuses them into a beam of ions suitable for injection into the quadrupole filter or other instrument.

When using such a device, it is usually desirable to have an accurate measurement of the ion stream or ion current being supplied to the quadrupole filter or other instrument. One conventional method for measuring ion current is typically to measure an ion current at the ion accelerator, since a portion of the ion stream impacts thereon. However, this method has several drawbacks. For example, the ion accelerator will often have electrical leakage. The measurement may also be affected by stray currents from the ionization process.

Another conventional method is to place an ion collector in the path of the ion stream. However, in this method the drawback is interference with the ion stream.

Also, in both of the above methods, and in others where, similarly, only a fraction of the ion stream is measured, it is difficult to judge the exact useable ion current by measuring the "test" fraction, because as the intensity of the total ion stream varies, the ratio between the "utilizable" portion of the ion stream and the "test" portion striking the measurement collector may vary in unknown ways.

When carrying out manufacturing processes in vacuum environments, it is frequently useful or necessary to employ a small, or "miniaturized", mass spectrometer to indicate the gas species present in the rarified atmosphere within the process zone. A miniature mass spectrometer is able to operate at higher absolute pressures (i.e., not as much vacuum) than a conventionally sized mass spectrometer, thereby being useful for monitoring some processes such as sputter deposition of thin films which cannot be monitored by conventional equipment. Such a mass spectrometer is commonly attached directly to the process vessel and operates in the vacuum generated by the process system. Mass spectrometers designed for this purpose frequently include a secondary sensing apparatus for indicating the operating vacuum level such as a total pressure collector or a vacuum gauge. For a quadrupole residual gas analyzer, it is desirable to indicate the ionization current as a total pressure measurement, in addition to filtering the ion current to indicate specific ion species.

A quadrupole mass spectrometer for analysis of gas samples typically includes the following: an ion source, an ion analyzer, such as a quadrupole mass filter, and an ion detector. In the ion source, a heated filament emits electrons which are directed into a defined ionization volume where they bombard incoming gas molecules from the gas sample being analyzed, giving them an electric charge. Charged molecules, i.e., ions, can be manipulated by an electric field. A pair of electrodes, namely an anode and a cathode create an electric field, through which the ions are extracted from the ionization volume and focused into a suitable ion beam by an ion lens assembly, also synonymously known to those of skill in the field as a "focus lens", "focus plate" or "extractor". The focused beam of ions is directed to the entrance of the ion analyzer (e.g. the mass filter), where the various species of ions are separated based on separate mass to charge ratios in a manner commonly known to those in the field. The selected ions directed through the mass filter can then be collected by an ion detector, such as a Faraday Cup or other similar device.

Referring briefly to FIG. 1, the "optics" of a conventional ion source used to converge and focus the ion beam at the entrance of the ion analyzer are a series of spaced parallel thin disc-or plate like elements, each element having a coaxial aperture wherein the assembly is known collectively as an ion lens. Typically, the ionization volume is defined by a cylindrical cross section created by the interior of the first electrode (e.g. the anode) having an electrical potential relative to ground. The innermost element defines the "bottom" periphery or border of the ionization volume. The remaining elements define a second electrode having applied thereto an opposite electrical potential relative to the anode which together with the anode produces an electric field. The electric field accelerates ions of opposite charge through the coaxial openings, converges the ions and forms a focused ion beam for directing to the ion analyzer. Three-element lens assemblies are common in which the potentials (voltages) on each of the elements are different, thereby establishing an ion energy, as well as a focusing effect to increase the ion output current. In addition, the described ion lens assembly also rejects undesirable secondary electrons formed through contact with the interior wall of the anode which may enter the focused ion beam.

Though three-element ion lens designs as described are quite effective for larger sized mass spectrometers or other analysis systems, it is desirable to reduce the size of these assemblies, particularly for corresponding miniaturized applications while maintaining the effectiveness of such systems.

An ion lens assembly, such as used for an ion source of a mass spectrometer, ideally produces an ion beam having intensity, suitable spatial geometry with respect to an ion analyzer, and velocity components such that: (1) the ion intensity transmitted by the ion analyzer to an adjacent ion detector is maximized, and (2) a mass resolved ion peak at the nominal mass, m, has an acceptable shape and peak width, Δm, at 10% of peak ion intensity. These two goals conflict; therefore, a balance between maximum ion intensity and acceptable peak width must be reached. Factors that can be varied to achieve optimization include the potentials on conductive focus elements, the shape of the focus element surface, the element surface conductivity, the element surface roughness and texture, the position of the first lens element with respect to the second lens element, and the thickness of the second lens element that transmits the ions to the ion analyzer.

OBJECTS AND SUMMARY OF THE INVENTION

Accordingly, it is an object of this invention to provide a method of measuring the ion current of an ion stream wherein the "test" ion stream being directly measured varies proportionally in the same way that the "utilizable" ion stream varies.

It s also an object of this invention to provide a method of measuring the ion current of an ion stream without affecting the ion stream.

It is another object of the invention to measure ionization current while diminishing errors due to electron leakage or stray currents from the ionization process.

It is a further object of the invention to be able to indicate the ion current as a total pressure measurement.

It is yet a further object of the present invention to provide a small, effective ion lens assembly which overcomes the limitations of those known and used in the prior art.

Another object of the present invention is to provide an ion lens assembly that is suitable for use in a miniaturized mass spectrometer.

A further object of the present invention is to provide an ion lens assembly which effectively prevents ion forming electrons from being passed into an adjacent ion analyzer.

Briefly stated, and according to a preferred aspect of the present invention, a miniaturized ion source for a mass spectrometer includes a anode and a focus plate whose interior surfaces form an ionization volume for a retained gas sample. Molecules of the gas sample are ionized by electrons, and the resulting ions are concentrated and converged through an exit aperture in the focus plate to the entrance of an ion analyzer, such as a quadrupole mass filter. Preferably, at least one of the anode and the focus plate includes a curved interior surface which converges the formed ions into a focused beam for directing into the ion analyzer. In addition, the thickness of the exit aperture of the focus plate and or the setback of the focus plate relative to the anode ensures that no line of sight exists between the interior surface of the anode from which ion-forming electrons can scatter into the adjacent ion analyzer.

According to another preferred aspect of the present invention, an ion source for a mass spectrometer includes first and second electrodes, each electrode having respective interior surfaces defining an ionization volume for an entering gas sample, ionizing means for ionizing molecules of the gas sample within the ionization volume to produce ions, the first electrode being frustoconical in shape, the second electrode having an exit aperture therein, wherein the internal surfaces of at least one of the first and second electrodes is effectively shaped for concentrating the produced ions in an ion beam and for converging the ion beam through the exit aperture.

Preferably, the anode includes a frusto-conically shaped interior surface and the focus plate includes an interior surface which is essentially perpendicular to a center axis of the anode. The interior surface of the focus plate alternately may assume a shallow convex or conical configuration. In addition, the thickness of the focus plate and the spacing between the respective interior surfaces minimizes the inclusion of ion-forming electrons in the resulting ion stream passing to the ion analyzer.

According to another preferred aspect of the present invention, an ion lens assembly includes an anode, the anode having a substantially frustoconical interior surface, and a focus plate of predetermined thickness having an exit aperture and an interior surface, the interior surfaces of the anode and the focus plate together forming an ionization volume, wherein at least one of said focus plate and said anode includes means for concentrating a plurality of ions formed within the ionization volume into an ion beam and converging the ion beam through the exit aperture of said focus plate.

According to yet another preferred aspect of the present invention, an ion source for a mass spectrometer includes first and second electrodes, the first and second electrodes having first and second interior surfaces, respectively, forming an ionization volume for a retained gas sample, ionizing means for ionizing molecules of the gas sample within the ionization volume to produce ions, the first electrode having a frustoconical interior surface, a side of the second electrode forming the ionization volume having a conical face, the second electrode having an exit aperture therein, the exit aperture having a depth such that all line of sight paths from the first interior surface to a point outside the exit aperture and outside the ionization volume are physically blocked, and the first and second electrodes being shaped effective for concentrating the ions in an ion beam and for converging the ion beam through the exit aperture.

According to yet another preferred aspect of the present invention, an ion lens assembly consists of an anode, the anode being frustoconical in shape, a focus plate having an exit aperture therein, the anode and the focus plate together forming an ionization volume therein, the anode and the focus plate forming means for concentrating a plurality of ions within the ionization volume into an ion beam and converging the ion beam through the exit aperture, and the exit aperture having a depth such that all line of sight paths from the first interior surface to a point outside the exit aperture and outside the ionization volume are physically blocked.

An advantage of the present invention is that the total current collector can be isolated from leakages and from stray radiation which limit the detection of small currents. Additionally, the total current is available at all times for emergency shutdown if required.

Another advantage of the present invention is that an ion lens assembly as described can be effectively used with a miniature mass spectrometer or other gas analysis system.

Another advantage of the present invention is that the described ion lens assembly is simple to manufacture, involves fewer parts, and requires less space than previously known assemblies.

Yet another advantage of the present invention is that the described ion lens assembly is smaller in design than known assemblies, yet is equally efficient in focusing an ion beam and for excluding ion-forming electrons from an adjacent ion analyzer.

The above, and other objects, features and advantages of the present invention will become apparent from the following description read in conjunction with the accompanying drawings, in which like reference numerals designate the same elements.

DETAILED DESCRIPTION OF THE INVENTION

Several embodiments according to the claimed invention are herein described. Throughout the course of discussion, a series of defining terms such as “front”, “back”, “top”, “bottom”, and the like are used. These terms are meant to provide a frame of reference in describing the invention as depicted in the accompanying drawings, and are not intended to be limitations of the invention as claimed. In addition, it will be readily apparent to those of ordinary skill in the field that other similar designs can easily be imagined employing the concepts described herein.

Figure 1:
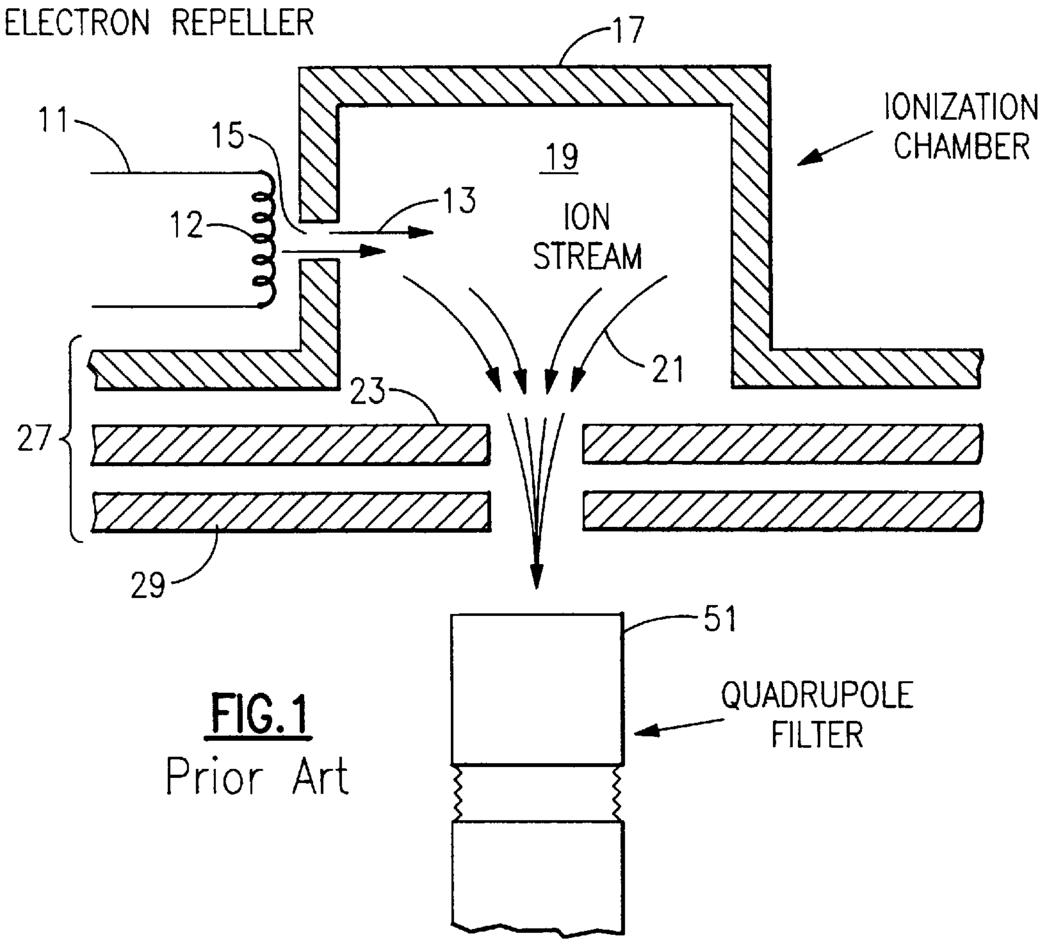
FIG.1 Prior Art
FIG. 1 is a cross-section of an ion source according to the prior art.

Referring to the drawings, a conventional ion source is illustrated in FIG. 1. An electron emitter 11 including a filament 12 emits electrons 13 that pass through an opening or slot 15 in an ionization chamber 17 into an ionization volume 19 containing rarified gas. The electrons interact with the gas molecules, ionizing some of them. The ions so produced are accelerated by an ion accelerator 23, and are focused into an ion beam for use by a quadrupole filter 51 or other instrument.

An ion lens assembly 27 in accordance with the prior art includes a series of concentric flat, thin disc-like elements, including an ion accelerator 23 and an exit lens 29 arranged in parallel spaced relation to one end of the ion source, the ion source including an anode having a cylindrical interior which defines the ionization volume 19.

In one embodiment of a dual ion source according to the invention, the dual ion source comprises a symmetrical combination of two conventional ion sources sharing a common ion volume. Electrons from a common electron emitter (or separate emitters) enter the ion volume preferably through two openings, forming ions in two locations. Two identical accelerator plates, electrically connected if desired, draw ion beams out of the ionization volume in respective different directions. The first ion beam is directed to a total current collector for measuring total ion pressure of the gas in the ion volume, and a second ion beam is directed to an analyzer, “analyzer” being defined herein as a mass spectrometer, quadrupole filter, or any other instrument that uses or analyzes an ion stream.

Figure 4:
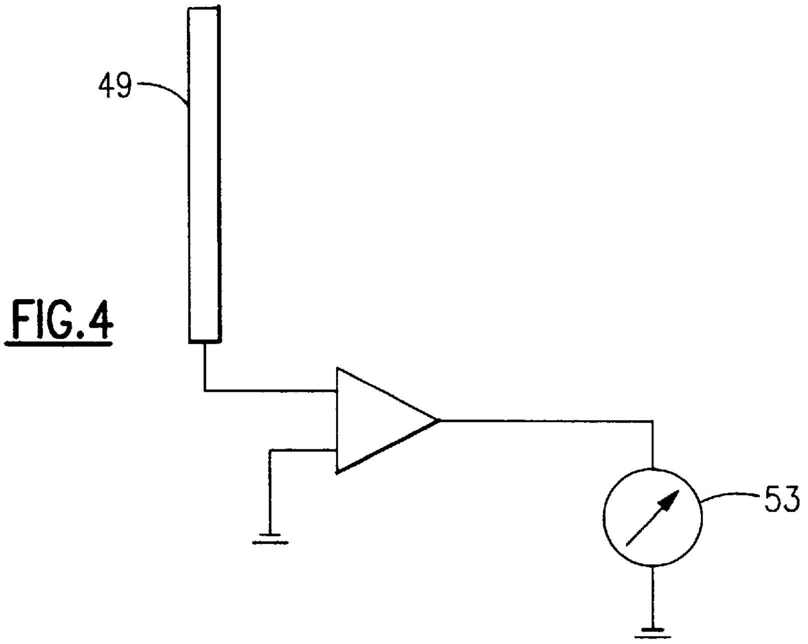
FIG. 4 is a simple functional diagram illustrating a current measuring means for calculating total ion pressure of gas within the ion volume from current measured at the ion collector.
Figure 2:
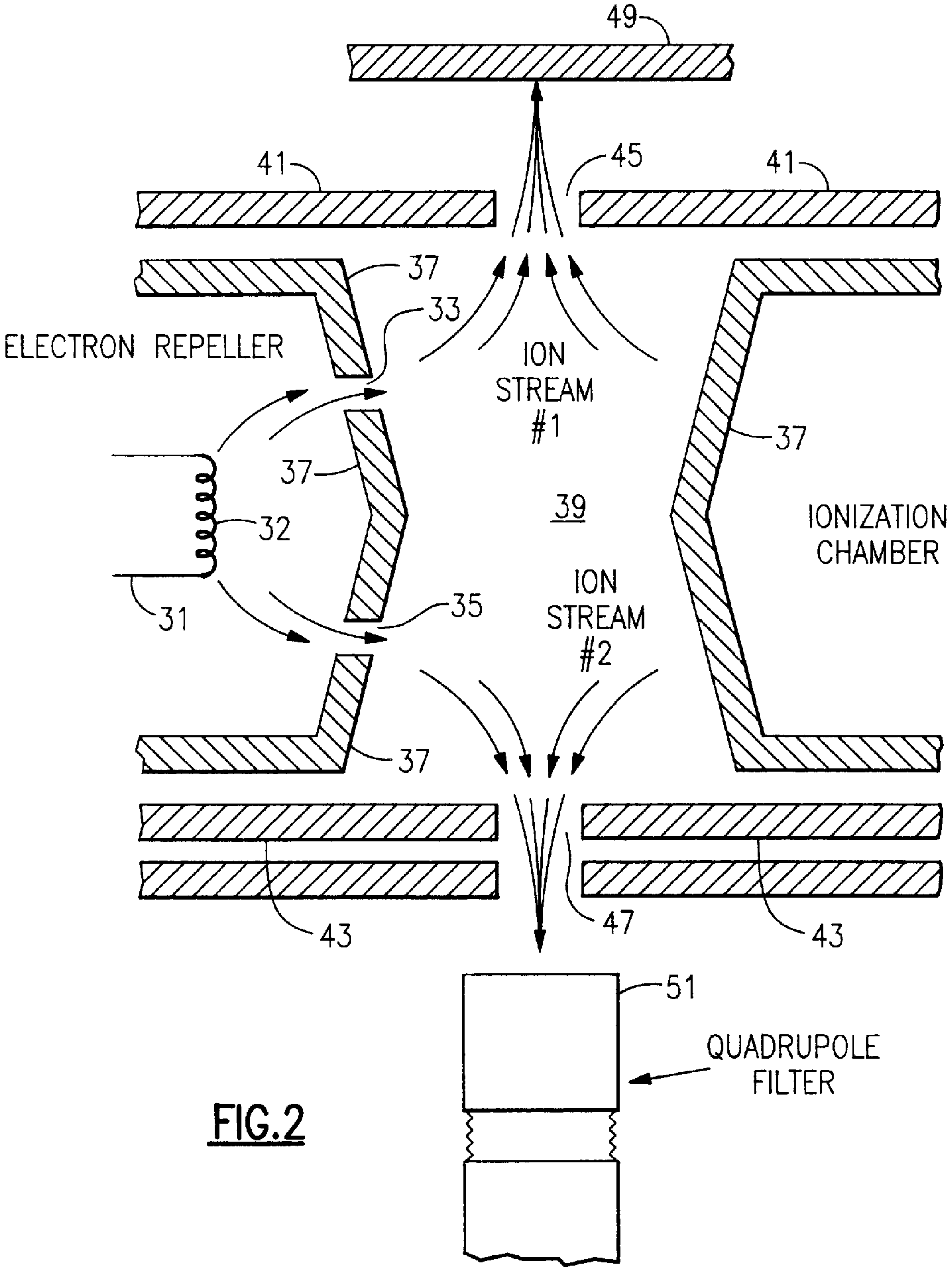
FIG. 2 is a cross-section of a dual ion source according to the present invention.

One embodiment of a dual ion source according to the invention is illustrated in FIG. 2. Electrons from the electron emitter 31, including one or more filaments 32, pass through openings 33, 35 in the ionization chamber 37 surrounding an ionization volume 39. The electrons interact with the gas within the ionization volume 39, forming ions. Two separate, preferably identical ion accelerators or focus plates 41, 43 draw and focus the ions into first and second ion streams, respectively, which pass through respective openings 45, 47 in the ion accelerators or focus plates 41, 43. The first or “test” ion stream, ion stream #1, is directed toward a total current collector 49. As illustrated in FIG. 4, current from the collector plate 49 can easily be measured and an indicator 53 can be calibrated to read the total ion pressure of the gas in the ionization volume 39. The indicator 53 can be anything from a simple gauge hand-calibrated to read in atmospheres, to a computer utilizing a-priori data to calculate total ion pressure based on the ion current measured at the collector plate 49.

Returning to FIG. 2, the second, or “utilizable” ion stream, ion stream #2, is directed to ion accelerator 43 toward quadrupole 51 or any other device utilizing ion streams. Once the total ionization pressure is measured as explained above, the magnitude of ion stream #2 can be readily calculated, since the same volume of gas in the ionization volume 39 is responsible for producing both ion streams.

Alternatively, calibration data can be obtained by placing a second current collector or other instrument (not shown) in place of the quadrupole filter 51, to calibrate the reading from ion stream #1 with the actual ion stream #2. This data may be obtained at the factory during construction of the dual ion source, or before integration of the dual ion source with the mass spectrometer or other instrument utilizing it. It will be understood that thereafter, by referencing the data obtained during the calibration, the ion current or magnitude of the second ion stream will be readily obtainable from the current reading received at the total pressure collector 49 from the first ion stream. FIG. 4 can also illustrate the current from the collector plate 49 being measured and (in this case) the indicator 53 can be calibrated (using the data obtained during the calibration) to read the ion current or magnitude of the second ion stream based on the current from the collector plate 49. Again, in this case the indicator 53 can be anything from a simple hand-calibrated gauge to a computer utilizing the data obtained during the calibration as a-priori data to calculate ion current or magnitude of the second ion stream based on the ion current of the first ion stream measured at the collector plate 49.

Figure 3:
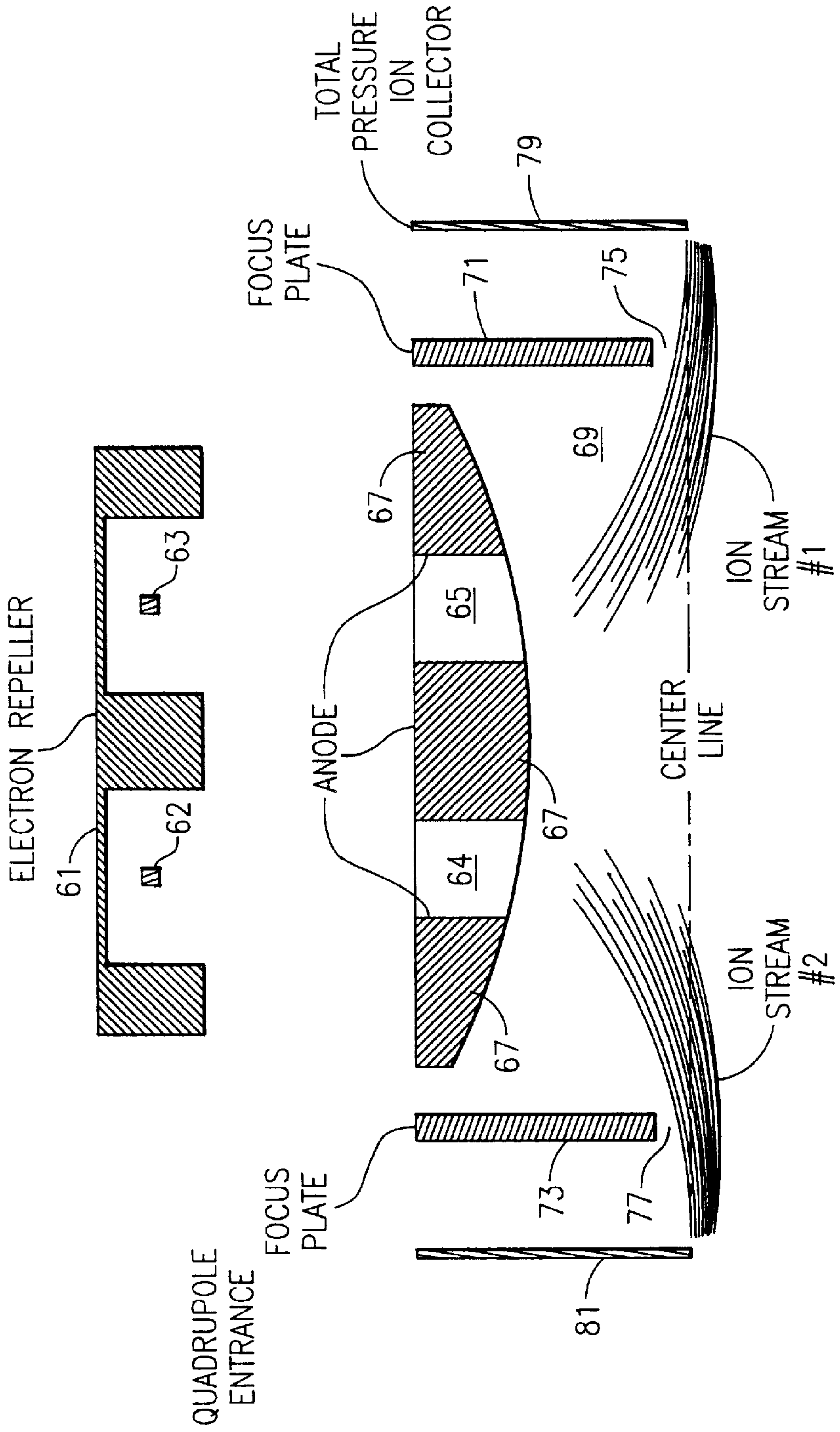
FIG. 3 is a partial cross-sectional diagram showing a particular configuration of the invention, and showing ion trajectories resulting therefrom.

FIG. 3 illustrates part of one particular configuration of an embodiment according to the present invention. An electron emitter 61 with two separate electron emitting filaments 62, 63 propels electrons through respective openings 64, 65 in an ion chamber plate 67, into an ion volume 69 containing a rarified gas, wherein ions are formed as the electrons interact with the gas. A potential difference is formed between the ion chamber plate 67 and focus plates 71, 73 so that ion chamber plate 67 acts as an anode and focus plates 71, 73 act as cathodes, in order that ion streams #1 and #2 are propelled through respective openings 75 and 77. Ion stream#1 arrives and is measured at the total pressure ion collector 79. Ion stream #2 arrives at a structure 81 which can represent either the entrance to a quadrupole mass filter or other analyzer, or a second current collector or other instrument for initial calibration as described above with reference to FIG. 2.

Figure 5:
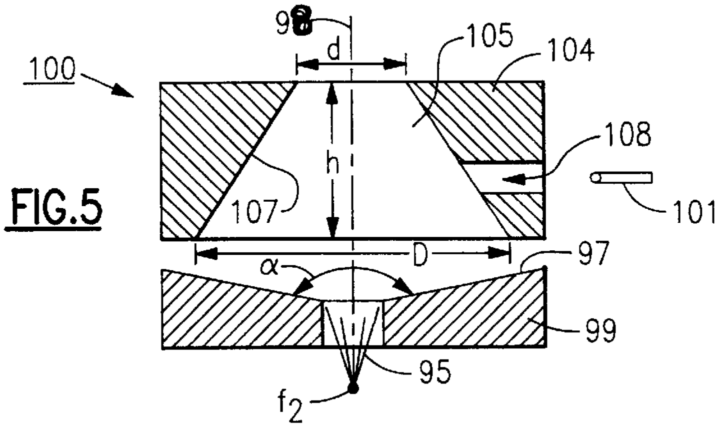
FIG. 5 shows an ion lens assembly as used with a single ion source and according to a preferred embodiment of the present invention.

Referring to FIG. 5, an ion lens assembly 100 in accordance with a first embodiment of the present invention is herein described with regard to a single ion source 102. A pair of electrodes, namely an anode 104 and a focus plate 99, together define an ionization volume 105. The interior surface 107 of the anode 104 has a substantially frustoconical shape, similar to that shown in FIG. 2, including a large diameter (D) of approximately 2.0 mm, a small diameter (d) of approximately 1.25 mm, and a height (h) or depth therebetween of approximately 1.5 mm. The anode 104 is maintained at a suitable positive electrical potential by a first electrical power supply (not shown), in a known manner so that positive ions can be withdrawn from the ionization volume 105. A slot 108 provided in a side of the anode 104 permits electrons generated by a heated filament 101 to enter the ionization volume 105 and ionize gas molecules of a sample gas contained therein in a manner commonly known.

The focus plate 99 (also referred to throughout the course of this discussion as an "accelerator"or "extractor") also includes an interior surface or face 97 which is preferably coaxially arranged with the anode 104. The focus plate 99 is maintained at a suitable potential, negative with respect to the anode 104, by a second electrical power supply (not shown). The focus plate 99 is thus able to attract positive gas ions generated within the ionization volume 105 by the electrons entering therein through the slot 108. In addition, the electric fields created by the electrical potentials existing between the anode 104 and the focus plate 99 focus the ions into a small diameter beam during the acceleration process. An exit aperture 95 passing through the entire thickness of the focus plate 99 has a cylindrical configuration which is coaxial with the focus plate and the anode 104. The exit aperture 95 permits the focused beam of ions to leave the ionization volume 105 and be directed to an ion analyzer (not shown). According to this embodiment, the exit aperture 105 preferably has a uniform diameter of 0.4 mm and a thickness of approximately 0.6 mm.

By appropriate sizing and shaping of the frusto-conical anode and the focus plate, an additional disc element is not required. Therefore, a two-element ion lens assembly has been described which efficiently converges and focuses the ion beam.

Figure 6:
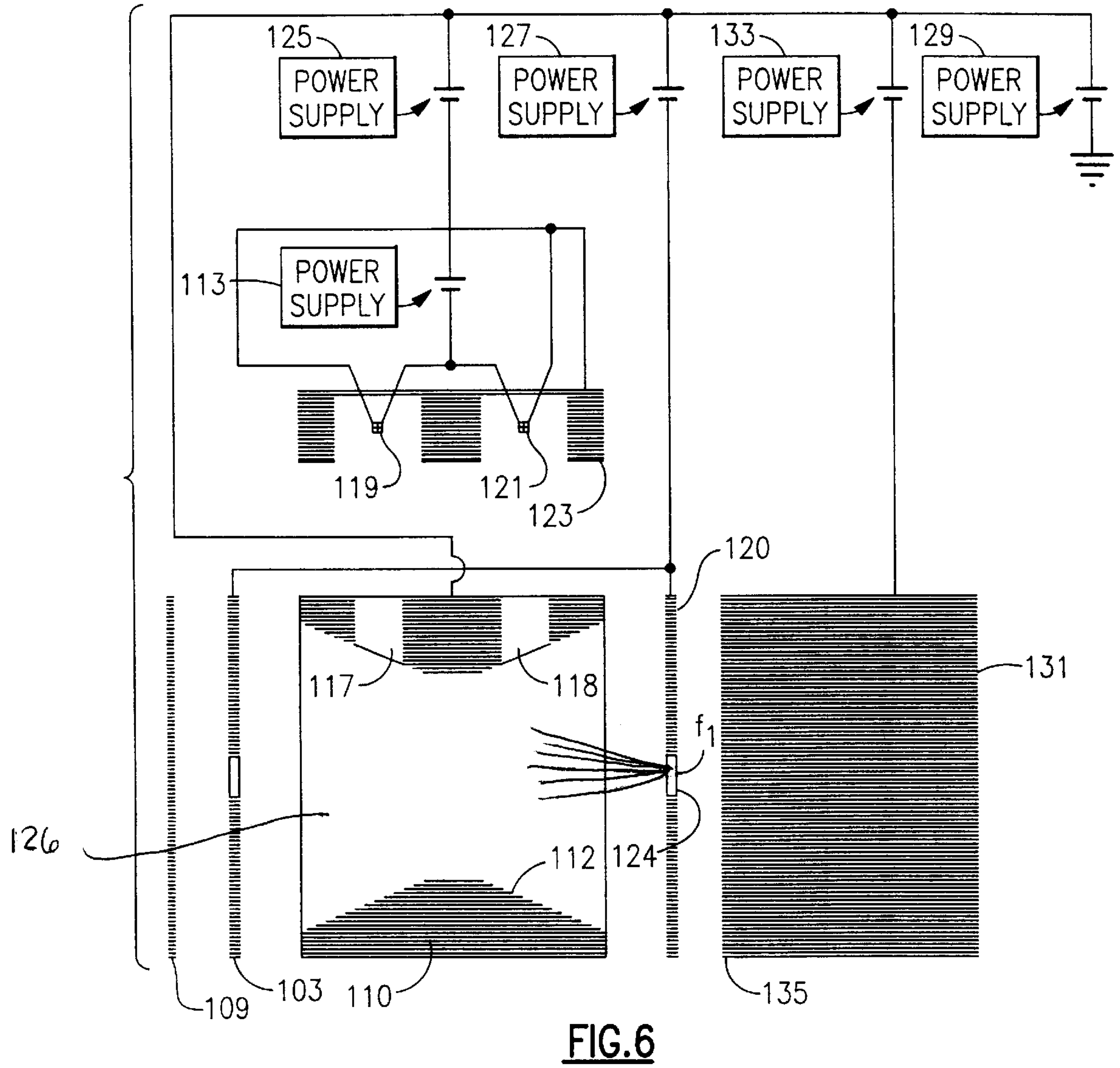
FIG. 6 shows a dual ion source utilizing a conical anode and a flat focus plate according to a second embodiment of the present invention.

Referring to FIG. 6, a second embodiment of an ion lens assembly according to the present invention is described with respect to a dual ion source. Like the preceding embodiment described in FIG. 2, an ionization volume 126 is formed by two electrodes, an anode 110 and a focus plate 120. Anode 110 includes a pair of adjacent frustoconical sections, each defined by an interior surface 112, similar in nature to that described in FIG. 2 above, wherein one end of the ion source is aligned with a total pressure collector plate 109 and the remaining opposite end is aligned with the focus plate 120. The focus plate 120, according to this embodiment, however, includes an essentially planar interior or facing surface 122. The purpose of the described lens assembly comprising the anode 110 and the focus plate 120 is to converge the ions and increase the ion intensity by increasing the number of ions per unit area passing through an exit aperture 124.

The anode 110 is maintained at a suitable positive electrical potential by a power supply 129. A pair of parallel slots 117, 118 in one side of the anode 110 permit electrons generated by two heated filaments 119, 121 to enter the ionization volume 126 and ionize gas molecules of the sample gas therein. An electron repeller 123, the details of which are commonly known in the field preferably drives the electrons towards the anode 110. Power supply 113 heats the filaments 119, 121 to a suitable temperature for electron emission. Power supply 125 biases the electron repeller 123. A power supply 133 powers the quadrupole mass filter 131, having an entrance 135 adjacently disposed relative to the focus plate 120.

The focus plate 120 is maintained at a suitable negative potential; that is, oppositely with respect to the anode 110, by a power supply 127, such that the focused ion beam can be directed toward the quadrupole mass filter 131. The focus plate 120 is thus able to attract positive gas ions generated within the ionization volume 126 by the electrons entering the ionization volume through the slot 121. The electric fields existing between the anode 110 and the focus plate 120 are such that the ions are focused into a small diameter beam during the acceleration process. The exit aperture 124 of focus plate 120 for the system herein described is preferably 12 mils (0.325 mm) in diameter, though this parameter can easily be varied depending on the application or intended use.

Since the focal point of the focused ion beam is close to the interior surface 112, the ion analyzer, shown here as a quadrupole mass filter 131, is relatively close to the focus plate 120. The focal point is beyond the exit aperture 124 at a point that depends on the potentials downstream of the ion flow.

Referring to FIGS. 5 and 6, and according to the present invention, the location of the focal point of the focused ion beam relative to the focus plate 120 is determined by the cone angle $\alpha$, of the internal face 97, 122 respectively of the focus plate. Employing a planar interior surface 122, like that shown in FIG. 6, results in an ion beam focal point f1 which is proximate the interior surface, whereas a conical face 122, as shown in FIG. 5, results in a focal point f2, which is located outside the ion lens assembly 100. Proper adjustment of the cone angle $\alpha$ permits establishing the focal point of the focused ion beam at the ion analyzer entrance aperture (not shown) to maximize ion transmission through the ion analyzer (not shown). For the dimensions of the anode 110, the focus plate 120, and the exit aperture 124 previously given above, an included cone angle $\alpha$ within a range of approximately 150–180° is acceptable. An included angle of 167° 20' according to this embodiment is more preferable.

Figure 7:
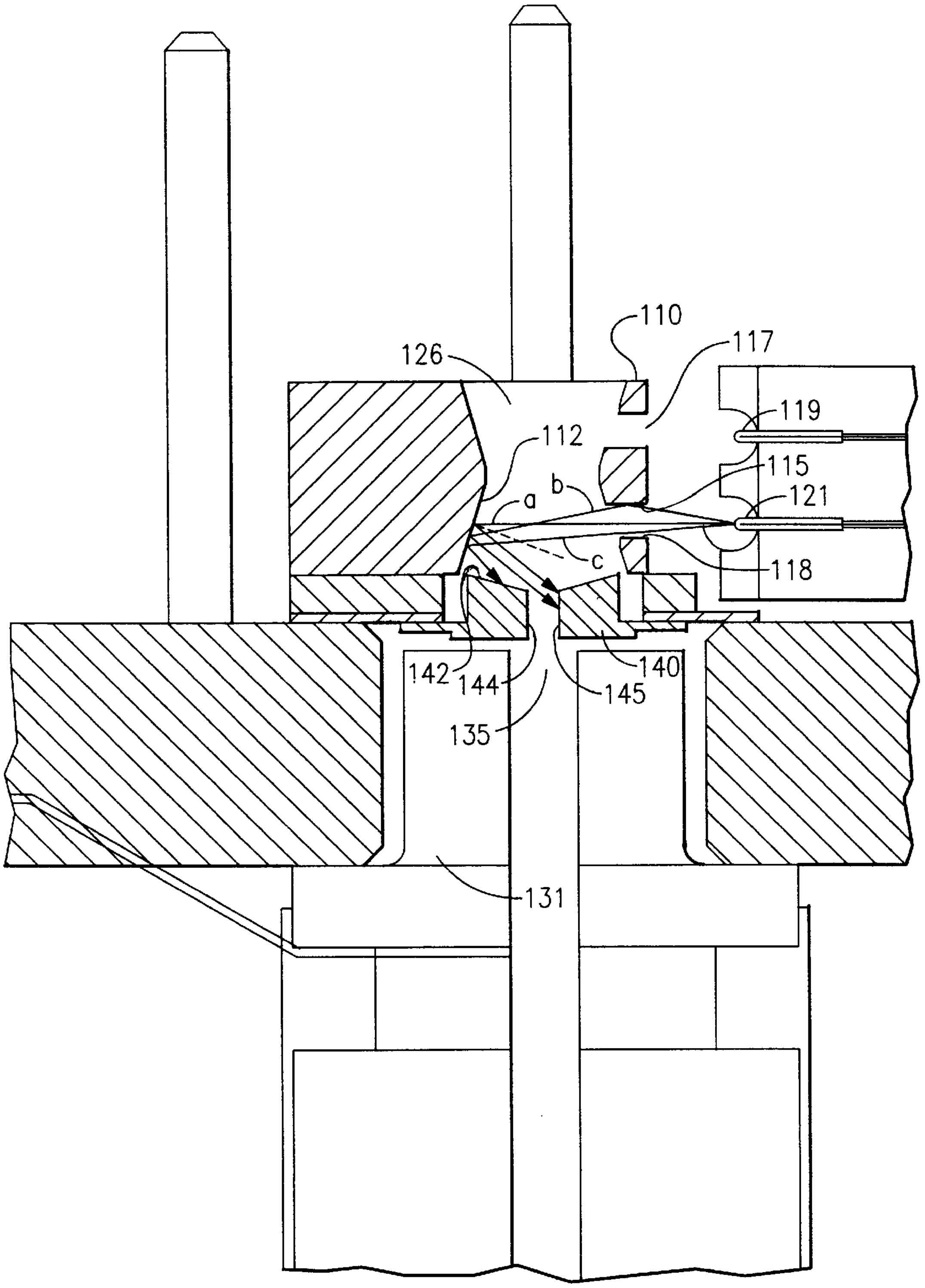
FIG. 7 shows a dual ion source mass spectrometer with a conical anode and conical focus plate according to a third embodiment of the present invention.

Referring now to FIG. 7, a third embodiment of an ion lens assembly in accordance with the present invention is now described. Similar parts will be labeled with the same reference numerals for the sake of convenience. The ion lens assembly includes an anode 110, as previously described and an adjacent focus plate 140. The focus plate 140 is similar to the focus plate according to the first embodiment of FIG. 5 but includes a greater overall thickness. A through exit aperture 144 includes a depth w which provides line-of-sight rejection of electrons scattered from the interior wall 112 of the anode 110 opposite the slots 117, 118.

In a conventional three-element ion lens system, such as illustrated in FIG. 1, one of the lens elements has a secondary function of repelling electrons due to the strong negative potential normally applied to thereto for accelerating the ions. Due to space limitations encountered in the miniaturization process, the lens assembly of the present invention has no electron repeller as one of its elements. Therefore, the focus plate 140 of the present embodiment has a secondary function of shielding the entrance 135 of the quadrupole mass filter 131 from stray electrons. The repulsion of the secondary electrons is herein described with reference to FIG. 7.

A series of electron paths are shown whereby electron path a depicts an electron emitted from the filament 121 reflecting from an inner wall 115 of the slot 118, reflecting off or scattering from the anode interior wall 112, and entering the focus plate aperture 144. Due to the thickness of the focus plate aperture 144, electrons following electron path a are absorbed in the aperture wall 145 before reaching the entrance to the quadrupole mass filter 131. Electron path b depicts an electron similarly emitted from the filament 121 entering directly through the slot 118 which is reflected or scattered off the anode interior wall 112 before entering the aperture 144. This electron is also absorbed in the aperture wall 145 before reaching the entrance 135 to the quadrupole mass filter 131. Finally, electron path c depicts an electron emitted from the filament 121 which obliquely passes through the slot 118 and is reflected off or scattered from the anode interior wall 112 and absorbed by the interior surface 142 of the focus plate 140, without reaching the aperture 144.

The thickness of depth w may be varied depending on the geometry of the ion lens assembly and is optimized such that none of the electrons following paths a, b, and c, or originating as secondary electrons on the interior surface 142, can pass through the focus plate aperture 144 to the entrance 135 of the quadrupole mass filter 131. Depth w is preferably of sufficient length that no line of sight path exists between any part of wall 112 and the quadrupole entrance 135. The thickness of depth w in the embodiment of FIG. 7 is preferably about 0.6 mm.

Figure 8:
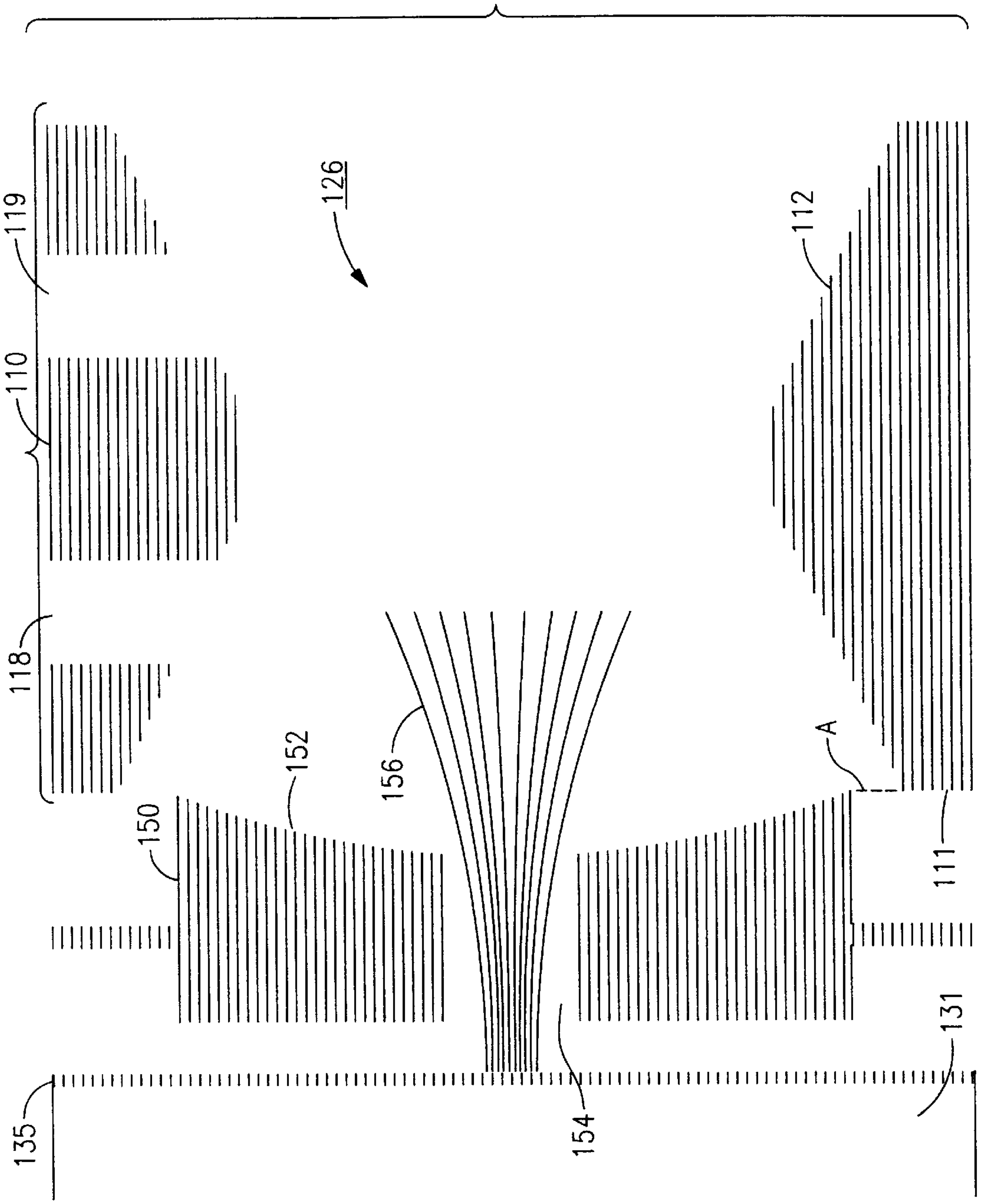
FIG. 8 shows a dual ion source mass spectrometer with a conical anode and a conical focus plate with no setback between the anode and focus plate according to a fourth embodiment of the present invention.

Referring to FIG. 8, a fourth embodiment of an ion lens assembly according to the present invention is herein described. Similar parts are herein labeled with the same reference numerals for the sake of convenience. The ion lens assembly comprises an ion source which includes a focus plate 150 having a conical internal surface 152, as well as the conical interior surface 112 of anode 110. This particular embodiment differs from the previously described first embodiment, shown in FIG. 5, in two respects.

First, the present embodiment uses a dual ion source, with ion-producing electrons entering the defined ionization volume 126 through a pair of adjacent slots 117, 118, whereas the embodiment of FIG. 5 utilizes a single ion source. Second, the accelerator in the embodiment of FIG. 8, i.e., focus plate 150, is flush with an edge 111 of the anode 110. That is, there is no setback, hereinafter defined as -x-, between the focus plate 120 and the anode 110 at a labeled region A. In this embodiment, the exit aperture 154 is preferably 15 mils (0.381 mm) in diameter though this parameter can easily be varied. The larger the diameter of the exit aperture, the less the convergence of the focused ion beam 156. The depth of the aperture 154 is preferably sufficient to prevent line of sight between any part of the interior wall 112 of the anode 110 and the entrance to the quadrupole mass filter 131. In other words, the thickness of the focus plate 150 reduces the quantity of scattered electrons entering the quadrupole 131, as similarly described in the preceding embodiment.

Figure 9:
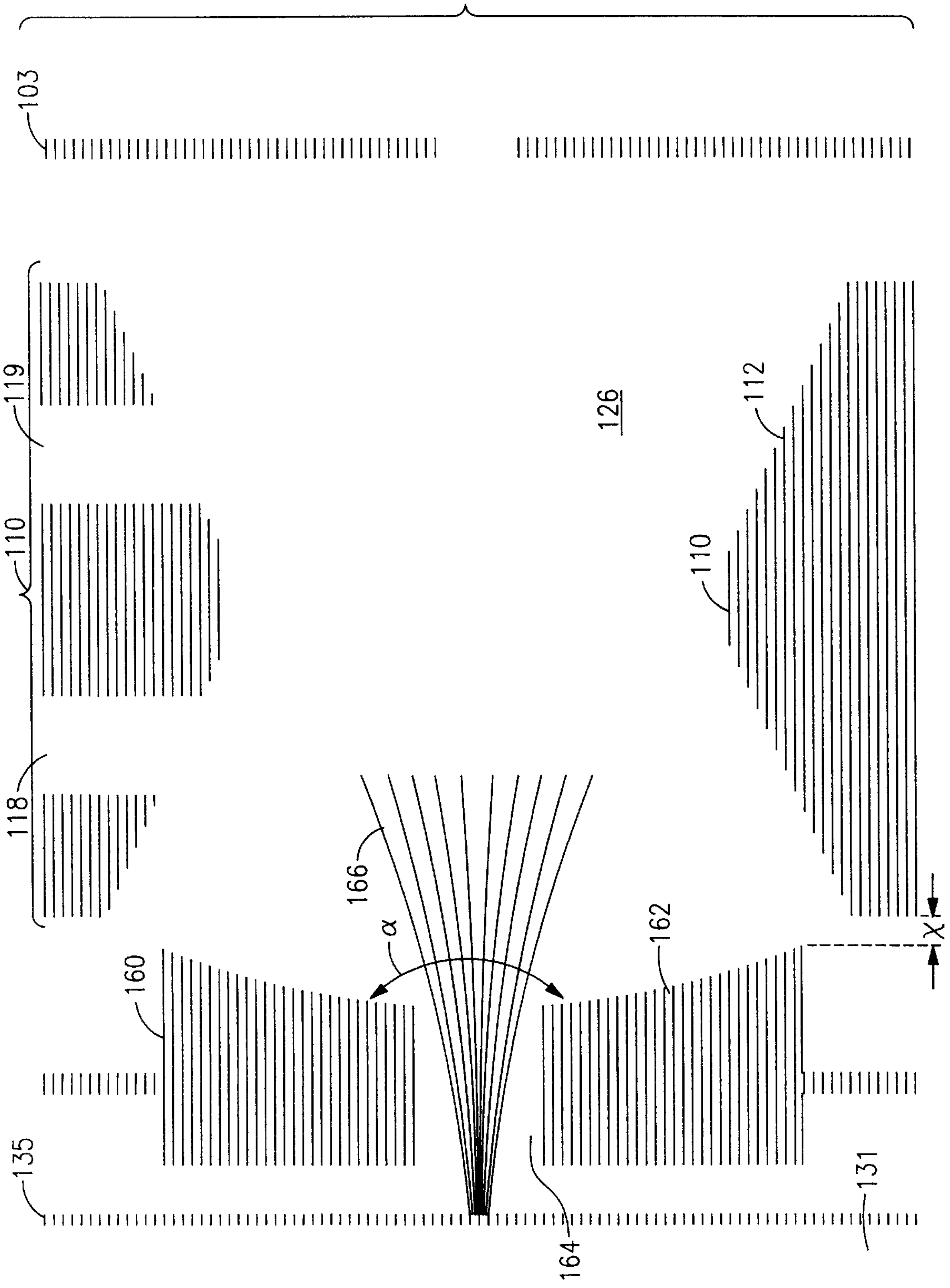
FIG. 9 shows a dual ion source mass spectrometer with a conical anode and a conical focus plate with a setback between the anode and focus plate according to a fifth embodiment of the present invention.

Referring to FIG. 9, a fifth embodiment of the present ion lens assembly is substantially identical to the previous fourth embodiment depicted in FIG. 8 above except a focus plate 160 is set back a predetermined distance from the edge 111 of the anode 110 to improve the convergence of the resulting ion beam. With an exit aperture of 15 mils (0.381 mm), setback -x- in labeled region A is preferably about 4.5 mils (0.115 mm). Note the difference in the degree of convergence between the ion beams 156, 166 of FIGS. 8 and 9. The cone angle $\alpha$ shown in FIG. 9 is approximately 150°.

Figure 10:
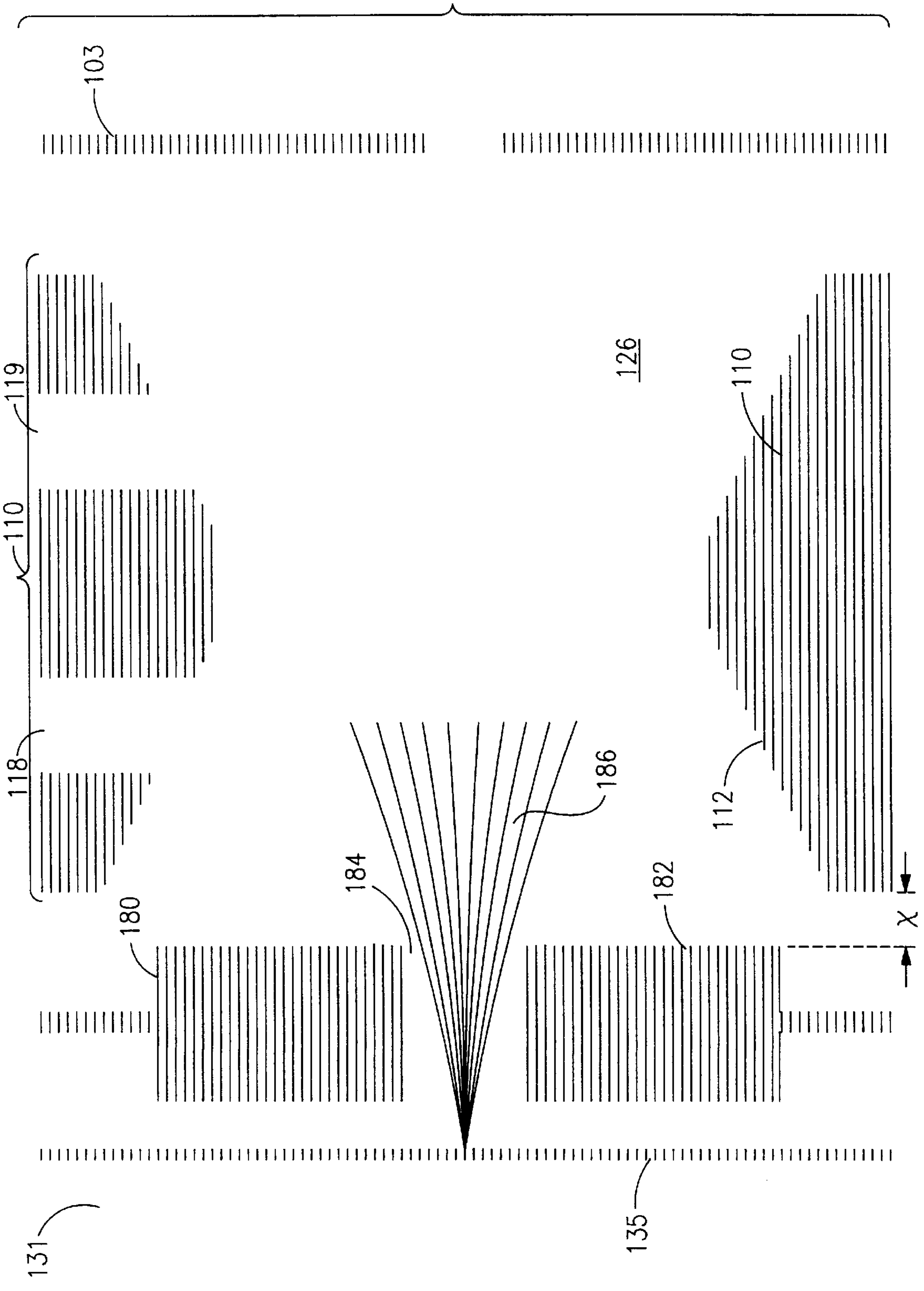
FIG. 10 shows a dual ion source mass spectrometer with a conical anode and a flat plate exit element according to a sixth embodiment of the present invention.

Referring to FIG. 10, a sixth embodiment of an ion lens assembly according to the present invention is herein described. As in the preceding, similar parts are labeled with the same reference numerals. The ion lens assembly comprises an anode 110 as previously described having a frusto-conical interior with respective slots 117, 118 for allowing the inclusion of heated electrodes. A relatively thick flat focus plate 180 includes an exit aperture 184 having a diameter of approximately 15 mils (approximately 0.381 mm). Like the embodiment of FIG. 9, a predetermined setback -x- or spacing is provided between the focus plate 180 and the edge 111 of the anode 110. As with the embodiment of FIG. 2, the purpose of the lens comprising the anode 110 and the focus plate 180 is to converge the ions and increase the ion intensity by increasing the number of ions per unit area passing through exit aperture 184. The greater the setback -x- in region A, the greater the convergence of the focused ion beam 186. As with the previous embodiments, the depth of aperture 184 is preferably sufficient to prevent line of sight between any part of the interior wall 112 of the anode 110 and the quadrupole mass filter 131. The width of the exit aperture 184 in FIG. 9 is approximately 15 mils (0.381 mm) and the setback (-x-) is approximately 9 mils (0.231 mm).

Figure 11:
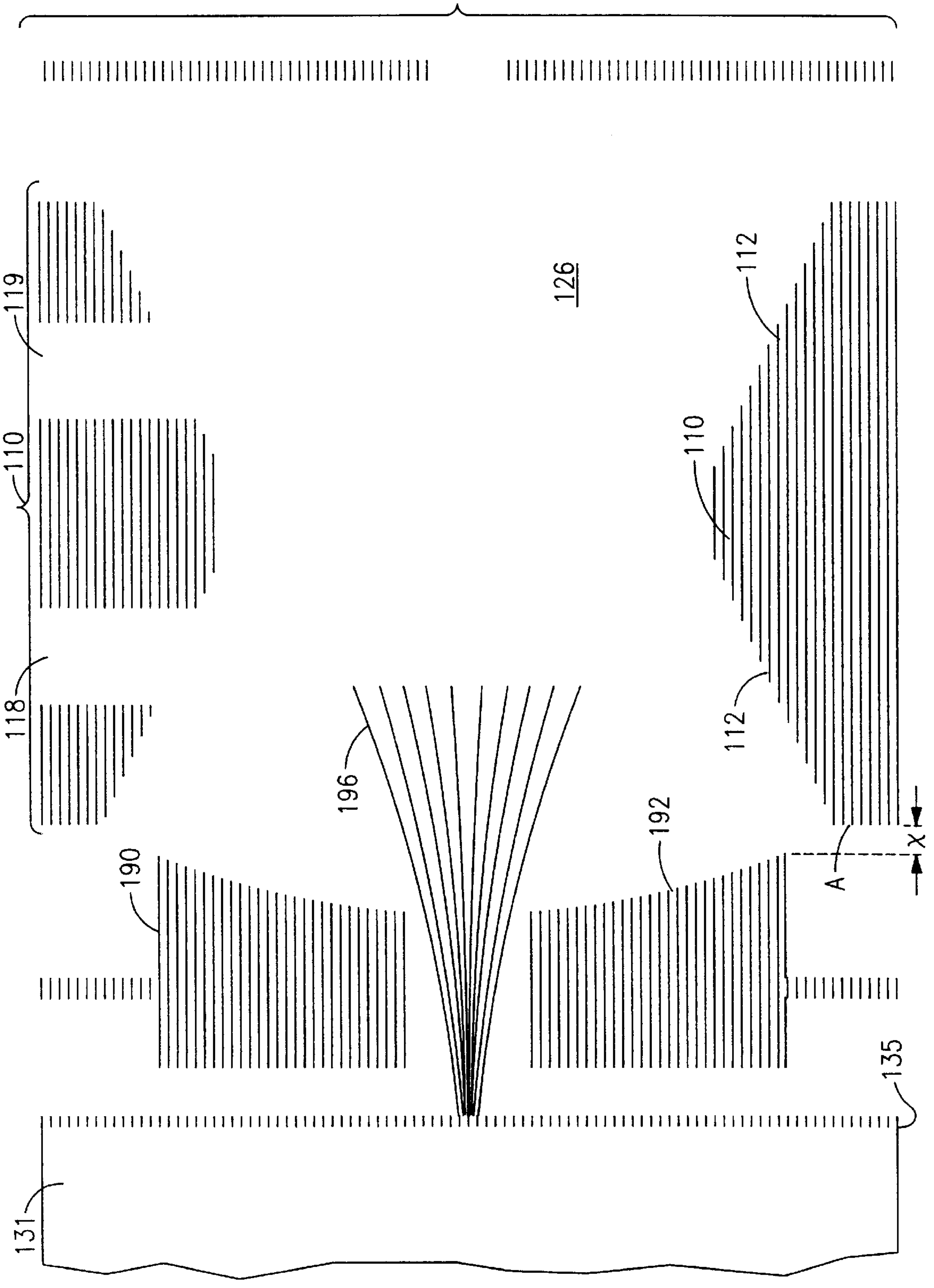
FIG. 11 shows a dual ion source mass spectrometer with a conical anode and a conical thick lens exit element according to a seventh embodiment of the present invention in which the exit element includes a shallower cone angle than that depicted in FIG. 9.

Referring to FIG. 11, a seventh embodiment of the ion lens assembly includes a two-element ion lens system which differs from that previously described and illustrated in FIG. 9 in that the cone angle $\alpha$ of the interior surface 192 of the focus plate 190 is approximately 160°, i.e., made more shallow, to improve the convergence of the ion beam 196. An exit aperture 190 having a diameter of approximately 15 mils (0.381 mm) and a setback (-x-) of approximately 4.5 mils (0.115 mm) is provided according to this embodiment.

In general, an increased setback -x-, measured between the anode and focus plate, requires an increased depth of the exit aperture of the focus plate to prevent secondary electrons from passing therethrough and toward the ion analyzer. An increased width of the exit aperture also requires an increased depth of the exit aperture. On the other hand, too small an exit aperture width reduces the ion output of the ion source. Parts List for FIGS. 1–11

11 electron emitter
12 filament
13 electrons
15 opening
17 ionization chamber
19 ionization volume
21 ions
23 focus plate

25 opening
27 ion lens assembly
29 exit lens
31 electron emitter
32 filaments
33 opening
35 opening
37 ionization chamber
39 ionization volume
41 focus plate
43 focus plate
45 opening
47 opening
49 total current collector/ collector plate
51 quadrupole mass filter
53 indicator
61 electron emitter
62 filament
63 opening
65 opening
67 ion chamber plate
69 ion volume
71 focus plate
73 focus plate
75 opening
77 opening
79 total pressure ion collector
81 structure
95 exit aperture
97 interior surface
98 center axis
99 focus plate
100 ion lens assembly
101 heated filament
102 single ion source
103 focus plate
104 anode
105 ionization volume
107 interior surface
108 slot
109 total pressure collector plate
110 anode
111 edge
112 interior surface (anode)
115 inner wall - slot
117 slot
118 slot
119 filament
120 focus plate
121 filament
122 interior surface
123 electron repeller
124 exit aperture
125 power supply
126 ionization volume
127 power supply
129 power supply
131 quadrupole
133 power supply
135 entrance quadrupole
140 focus plate
142 interior surface
144 exit aperture
145 aperture wall
150 focus plate
152 interior surface
154 exit aperture
156 ion beam
160 focus plate
162 interior surface
164 exit aperture
166 ion beam
180 focus plate
182 interior surface
184 exit aperture
186 ion beam
190 focus plate
192 interior surface
194 exit aperture
196 ion beam
a electron path
b electron path
c electron path
w width exit aperture
α cone angle
x set back Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. An ion source for a mass spectrometer, said mass spectrometer further including ion analyzing means disposed adjacent said ion source, said ion source comprising:

first and second electrodes, each said electrode having opposite electrical potentials and respective interior surfaces which define an ionization volume for a retained gas sample; and ionizing means for ionizing molecules of said gas sample within said ionization volume to produce ions;

wherein one of said first and second electrodes includes an interior surface which is curved to converge said formed ions into a focused beam, said second electrode having an exit aperture through which said focused beam is directed to said ion analyzing means.

2. An ion source according to claim 1, wherein said first electrode includes a frustoconical interior surface.

3. An ion source according to claim 2, wherein said interior surface of said second electrode includes a conical interior surface having an included angle in the range of about 150 degrees to about 180 degrees.

4. An ion source according to claim 3, wherein said conical interior surface has an included angle of 157 degrees 20 minutes.

5. An ion source according to claim 1, wherein said second electrode includes an essentially planar interior surface, said surface being substantially perpendicular to a center axis of said first electrode and in which said exit aperture is coaxially aligned with said center axis.

6. An ion source according to claim 1, wherein said ionizing means includes at least one filament arranged in at least one slot of said first electrode, said at least one filament being heated to produce ions in said ionization volume.

7. An ion source according to claim 1, wherein an axis of said ionizing means is substantially perpendicular to an axis of said exit aperture.

8. An ion source according to claim 1, wherein a distance measuring an offset, measured parallel to an axis of said aperture, between the interior surfaces of said first and second electrodes is zero.

9. An ion source according to claim 1, wherein a distance measuring an offset, measured parallel to an axis of said aperture, between the interior surfaces of said first and second electrodes is a predetermined distance.

10. An ion source according to claim 9, wherein said offset between said interior surfaces of said first and second electrodes is about 4.5 mils (0.115 mm).

11. An ion source according to claim 1, further comprising trapping means for trapping electrons scattered within said ionization volume so that said scattered electrons are unable to pass through said exit aperture and into said ion analyzing means.

12. An ion source according to claim 11, wherein said trapping means includes physically blocking all line of sight paths from said first interior surface to a point outside said exit aperture and outside said ion volume.

13. An ion source according to claim 11, wherein said trapping means includes said exit aperture having a length such that all line of sight paths from the interior surface of said first electrode to a point outside said exit aperture and outside said ionization volume are physically blocked.

14. An ion source according to claim 13, wherein said length of said exit aperture is about 0.6 mm.

15. An ion source according to claim 1, wherein the interior surface of said first electrode has a major diameter of about 2.0 mm, a minor diameter of about 1.25 mm, with the distance between said major and minor diameters being approximately 1.5 mm.

16. An ion source according to claim 1, further including means for trapping secondary electrons originating on said first interior surface so that said secondary electrons are unable to pass entirely through said exit aperture and into said ion analyzing means.

17. An ion source for a mass spectrometer, comprising:

first and second electrodes;

said first and second electrodes having first and second interior surfaces, respectively, forming an ion volume for a retained gas sample;

ionizing means for ionizing molecules of said gas sample within said ion volume to produce ions;

said first electrode having an interior surface which is frustoconical in shape;

said interior surface of said second electrode being conical;

said second electrode having an exit aperture therein;

wherein said exit aperture includes a depth such that all line of sight paths from said first interior surface to a point outside said exit aperture and outside said ion volume are physically blocked; and in which the interior surfaces of at least one of said first and second electrodes effectively concentrates ions formed in said ionization volume into a focused ion beam for converging through said exit aperture.

18. An ion lens assembly, consisting of:

an anode having a substantially frusto-conical interior surface; and a focus plate having an interior surface and an exit aperture passing through the thickness of said plate;

the respective interior surfaces of said anode and said focus plate further defining an ionization volume; in which the interior surfaces of one of said anode and said focus plate is shaped so as to concentrate a plurality of ions formed within said ion volume into an ion beam and converging said ion beam through the exit aperture, said exit aperture having a depth such that all line of sight paths from said first interior surface to a point outside said exit aperture and outside said ion volume are physically blocked.

* * * * *